(12) United States Patent
Harper et al.

(10) Patent No.: US 11,309,649 B2
(45) Date of Patent: Apr. 19, 2022

(54) FLOATING CONNECTOR ASSEMBLY

(71) Applicant: Apple Inc., Cupertino, CA (US)

(72) Inventors: James E. Harper, Paso Robles, CA (US); Mahmoud R. Amini, Sunnyvale, CA (US); Rui Zhou, Sunnyvale, CA (US)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 16/586,603

(22) Filed: Sep. 27, 2019

(65) Prior Publication Data

US 2020/0379188 A1 Dec. 3, 2020

Related U.S. Application Data

(60) Provisional application No. 62/855,753, filed on May 31, 2019.

(51) Int. Cl.
| | |
|---|---|
| H05K 5/02 | (2006.01) |
| H01R 13/187 | (2006.01) |
| H05K 7/14 | (2006.01) |
| H05K 5/00 | (2006.01) |
| G02B 6/38 | (2006.01) |
| G06F 1/16 | (2006.01) |

(52) U.S. Cl.
CPC ......... *H01R 13/187* (2013.01); *H05K 5/0013* (2013.01); *H05K 5/0217* (2013.01); *H05K 5/0247* (2013.01); *H05K 7/1401* (2013.01); *G02B 6/3825* (2013.01); *G02B 6/3882* (2013.01); *G02B 6/3893* (2013.01); *G02B 6/3897* (2013.01); *G06F 1/1684* (2013.01)

(58) Field of Classification Search
CPC .. H01R 13/187; H05K 5/0013; H05K 5/0217; H05K 5/0247; H05K 7/1401; G02B 6/3825; G02B 6/3882; G02B 6/3893; G02B 6/3897; G06F 1/1684
See application file for complete search history.

(56) References Cited

U.S. PATENT DOCUMENTS

| | | | |
|---|---|---|---|
| 9,722,381 B1 * | 8/2017 | Moen | H05K 7/1491 |
| 2009/0068870 A1 * | 3/2009 | Mezhinsky | H01R 13/6315 439/247 |

* cited by examiner

*Primary Examiner* — James Wu
*Assistant Examiner* — Hung Q Dang
(74) *Attorney, Agent, or Firm* — Kilpatrick Townsend and Stockton, LLP (57) ABSTRACT

An electronic device includes a housing having a front wall and a floating connector assembly coupled to the front wall. The connector assembly includes a panel and a connector. The connector includes a frame attached to the panel and defines first and second alignment openings. A sleeve extends from the frame and extends through the front wall. A removable cover for the electronic device includes first and second connector alignment pins that align with the first and second alignment openings to align the connector sleeve with a connector aperture defined by the cover. The first and second connector alignment pins and the first and second alignment openings can each include tapered portions to move the connector assembly into alignment with the connector aperture as the cover is attached with the housing.

20 Claims, 7 Drawing Sheets

FLOATING CONNECTOR ASSEMBLY

CROSS-REFERENCES TO OTHER APPLICATIONS

This application claims priority to U.S. provisional patent application Ser. No. 62/855,753, for "FLOATING CONNECTOR ASSEMBLY" filed on May 31, 2019 which is hereby incorporated by reference in entirety for all purposes.

FIELD

The described embodiments relate generally to electronic devices that include one or more externally accessible connectors. More particularly, the present embodiments relate to an electronic device that includes a removable cover and a connector assembly that aligns with an aperture formed in the removable cover when the cover is attached to the electronic device.

BACKGROUND

Currently there are a wide variety of electronic devices that include one or more electrical connectors positioned at an exterior surface of the electronic device. Some electronic devices have one or more exterior covers that are detachable from the electronic device allowing a user to access components within an interior of the electronic device. In some electronic devices the exterior covers are fitted over the same surface of the electronic device that is equipped with the one or more electrical connectors. The interface between the electrical connectors and the cover can be difficult to align which may adversely affect the aesthetics of the electronic device as well as a user's access to the electrical connectors. Additionally, as electrical connectors reduce in size, these challenges may become more difficult. New features are needed to improve the alignment of electrical connectors with corresponding apertures formed in covers of electronic devices.

SUMMARY

In some embodiments an electronic device comprises a housing including a front wall, a rear wall opposite the front wall and a plurality of sidewalls extending between the front wall and the rear wall, wherein the front wall defines first and second apertures. A connector assembly includes a panel and an electrical connector, the electrical connector having a frame attached to the panel and a sleeve extending from the frame, wherein the sleeve is configured to receive a mating connector and the frame defines first and second alignment openings. A compliant coupling attaches the panel to the housing and positions the first and second alignment openings in alignment with the first and second apertures, respectively, wherein the compliant coupling allows the panel to move parallel to the front wall. A cover is removably attached to the front wall and includes first and second connector alignment pins that are aligned with and positioned within the first and second alignment openings and within the first and second apertures such that the sleeve is aligned with a connector aperture defined by the cover.

In some embodiments the cover includes first and second cover alignment pins that are aligned with and positioned within first and second alignment apertures defined by the front wall such that the cover is aligned with the housing. In various embodiments the first and second cover alignment pins extend a first distance from the cover, the first and second connector alignment pins extend a second distance from the cover, wherein the first distance is greater than the second distance. In some embodiments the first alignment opening is a hole and the second alignment opening is a slot. In various embodiments the sleeve is a first sleeve and the connector assembly includes a second sleeve extending from the frame.

In some embodiments the frame includes a plurality of pins that extend from the frame and attach the frame to the panel. In various embodiments the panel is a circuit board. In some embodiments the compliant coupling includes a plurality of fasteners that extend through a plurality of respective mounting holes defined by the panel and wherein a diameter of the plurality of fasteners is less than a diameter of the mounting holes.

In some embodiments an electronic device comprises a housing including a front wall that defines first and second apertures and a panel attached to the housing with a compliant coupling. A connector includes a frame attached to the panel and defines first and second alignment openings that are aligned with first and second apertures. A cover is removably attached to the front wall and includes first and second connector alignment pins that are aligned with and positioned within the first and second alignment openings and within the first and second apertures such that a portion of the connector is positioned within a connector aperture defined by the cover.

In some embodiments the connector includes a pair of sleeves that extend from the frame. In various embodiments the cover includes first and second cover alignment pins that align with first and second alignment apertures defined by the front wall such that the cover is aligned with the housing. In some embodiments the first alignment opening is a hole and the second alignment opening is a slot. In various embodiments the frame includes a plurality of pins that extend from the frame and attach the frame to the panel. In some embodiments the panel is a circuit board. In some embodiments the compliant coupling includes a plurality of fasteners that extend through a plurality of respective mounting holes defined by the panel and wherein a diameter of the plurality of fasteners is less than a diameter of the mounting holes.

In some embodiments an electronic device comprises a housing including a front wall having an exterior surface opposite an interior surface and defining first and second apertures. A panel is positioned proximate the interior surface and is attached to the housing with a compliant coupling. A connector includes a frame and a sleeve, wherein the frame defines first and second alignment openings that are aligned with first and second apertures and the frame is positioned between the panel and the interior surface, and wherein the sleeve extends from the frame through a connector opening defined by the front wall. A cover is removably attached to the front wall and includes first and second connector alignment pins that are aligned with and positioned within the first and second alignment openings and within the first and second apertures such that a portion of the sleeve is positioned within a connector aperture defined by the cover.

In some embodiments the sleeve is a first sleeve and the connector includes a second sleeve extending from the frame. In various embodiments the cover includes first and second cover alignment pins that align with first and second alignment apertures defined by the front wall such that the cover is aligned with the housing. In some embodiments the first alignment opening is a hole and the second alignment opening is a slot. In various embodiments the compliant coupling includes a plurality of fasteners that extend through a plurality of respective mounting holes defined by the panel and wherein a diameter of the plurality of fasteners is less than a diameter of the mounting holes.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

In order to better appreciate the features and aspects of the present disclosure, further context for the disclosure is provided in the following section by discussing one particular implementation of an electronic device that includes one or more electrical connectors that are aligned with corresponding alignment apertures formed in an exterior cover of the electronic device. In further embodiments the electrical connectors can remain functional whether or not the cover is attached to the electronic device, according to embodiments of the disclosure. These embodiments are for explanatory purposes only and other embodiments may be employed in other electronic devices. For example, embodiments of the disclosure can be used with any device that receives or transmits audio, video or data signals. In some instances, embodiments of the disclosure are particularly well suited for use with computing devices because of their use of one or more electronic connectors that are accessible at an exterior of the computing device.

For example, in some embodiments an electronic device includes a housing that has a detachable cover that when detached enables a user to access components within the housing. The cover can be positioned over a portion of the housing that includes an electrical connector that is accessible through the cover when the cover is attached, and is accessible at a surface of the housing when the cover is detached. The connector can be a part of a floating connector assembly that is attached to the housing with a compliant coupling. When the cover is attached to the housing a connector alignment mechanism positions the connector in alignment with a connector aperture formed through the cover such that a user can access to the connector with the cover attached, providing an aesthetically appealing exterior appearance for the electronic device.

In another example the alignment mechanism includes alignment pins attached to the cover and corresponding alignment apertures formed in the housing that align the connector to the cover when the cover is attached to the housing. In a further example the floating connector assembly can include a frame that includes alignment holes and electrically and mechanically couples the connector to a floating circuit board.

In order to better appreciate the features and aspects of connector alignment features for electronic devices according to the present disclosure, further context for the disclosure is provided in the following section by discussing one particular implementation of an electronic device according to embodiments of the present disclosure. These embodiments are for example only and other embodiments can be employed in other electronic devices such as, but not limited to computers, watches, media players and other devices.

Figure 1:
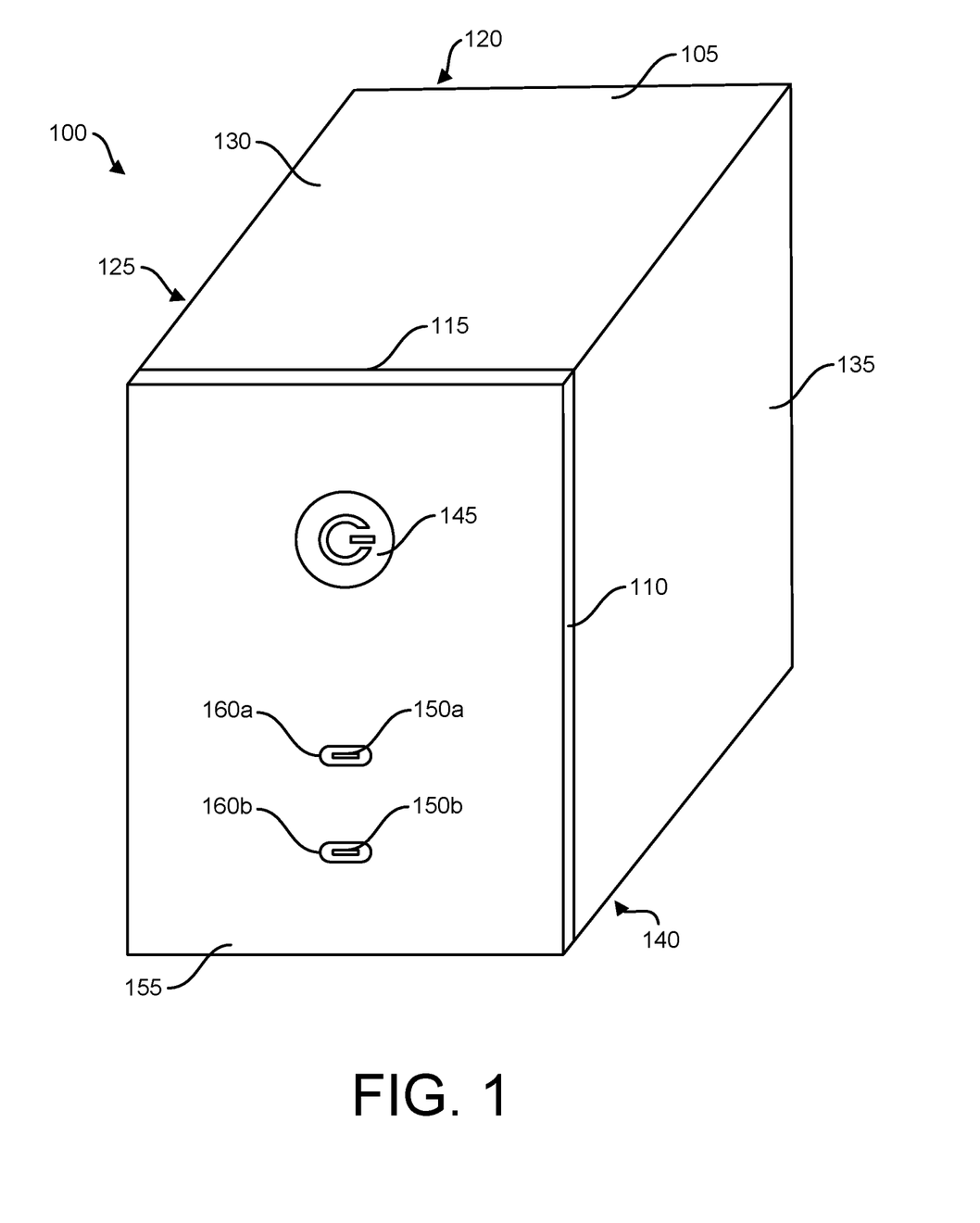
FIG. 1 is a front perspective view of an electronic device including a floating connector assembly according to an embodiment of the disclosure.

FIG. 1 depicts a simplified isometric view of an electronic device 100, according to some embodiments of the disclosure. As shown in FIG. 1, electronic device 100 includes a housing 105 having a detachable front cover 110, attached to a front wall 115 of the housing. Housing 105 further includes a rear wall 120 opposite front wall 115, and four side walls 125, 130, 135, 140 extending between the front wall and rear walls. Electronic device 100 can be any type of computing device including, but not limited to, a stationary computer, a portable computer, a portable media device, a gaming device, a printer, a peripheral electronic device or a camera. Computing device 100 can also have any suitable shape including, but not limited to, a cube, a cuboid, a cylinder or a rectangular prism.

Electronic device 100 further includes a power button 145 and first and second receptacle connectors 150a, 150b positioned at exterior surface 155 of front cover 110. In other embodiments electronic device 100 may have other connectors, indicator lights, buttons or other interface devices at exterior surface 155 of front cover 110. In some embodiments first and second receptacle connectors 150a, 150b are aligned with corresponding first and second apertures 160a, 160b of cover 110 such that the first and second receptacle connectors are accessible by a user (with and without cover attached) and enabling electronic device 100 to have an appealing exterior appearance, as described in more detail below.

Figure 2:
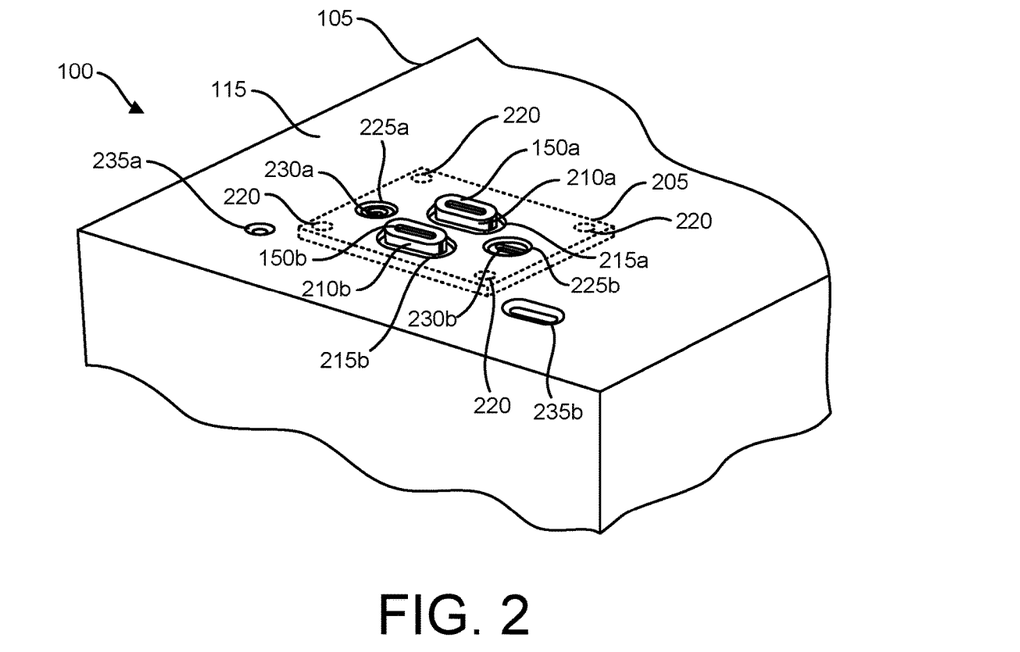
FIG. 2 is an isometric view of a portion of the electronic device that includes the floating connector assembly shown in FIG. 1.

Now referring to FIG. 2 a simplified partial view of front surface 115 of housing 105 with cover 110 (not shown in FIG. 2) removed is illustrated. As shown in FIG. 2, front surface 115 includes first and second electrical connectors 150a, 150b coupled to a floating connector assembly 205 (shown in hidden lines) such that a portion of first and second sleeves 210a, 210b of each corresponding connector protrude through first and second corresponding penetrations 215a, 215b formed through housing 105. First and second penetrations 215a, 215b are larger than first and second electrical connector sleeves 210a, 210b enabling first and second electrical connectors 150a, 150b to move in-plane with floating connector assembly 205. More specifically, floating connector assembly 205 is attached to housing 105 with a compliant coupling 220 that allows the floating connector assembly to move in-plane (e.g., parallel with front surface 115) such that first and second electrical connectors 150a, 150b can be positioned to align with first and second apertures 160a, 160b (see FIG. 1) in cover 110, as described in more detail below. In other embodiments first and second penetrations 215a, 215b may be replaced by a larger penetration accommodating both first and second electrical connectors 150a, 150b.

Front surface 115 of housing 105 also defines first and second holes 225a, 225b that are formed through the housing and are portions of a connector alignment mechanism that enables first and second connectors 150a, 150b to align with first and second corresponding apertures 160a, 160b in cover 110 when the cover is attached to housing 105, as described in more detail below. First and second holes 225a, 225b allow access to first and second alignment openings 230a, 230b of floating connector assembly 205 that aligns first and second connectors 150a, 150b with first and second apertures 160a, 160b in cover 110 when the cover is attached to housing 105, as described in more detail below.

Front surface 115 further defines first and second alignment apertures 235a, 235b that are formed through housing 105 and are portions of a cover alignment mechanism that enables the cover to be aligned with the housing when the cover is attached to the housing, as described in more detail below.

Figure 3:
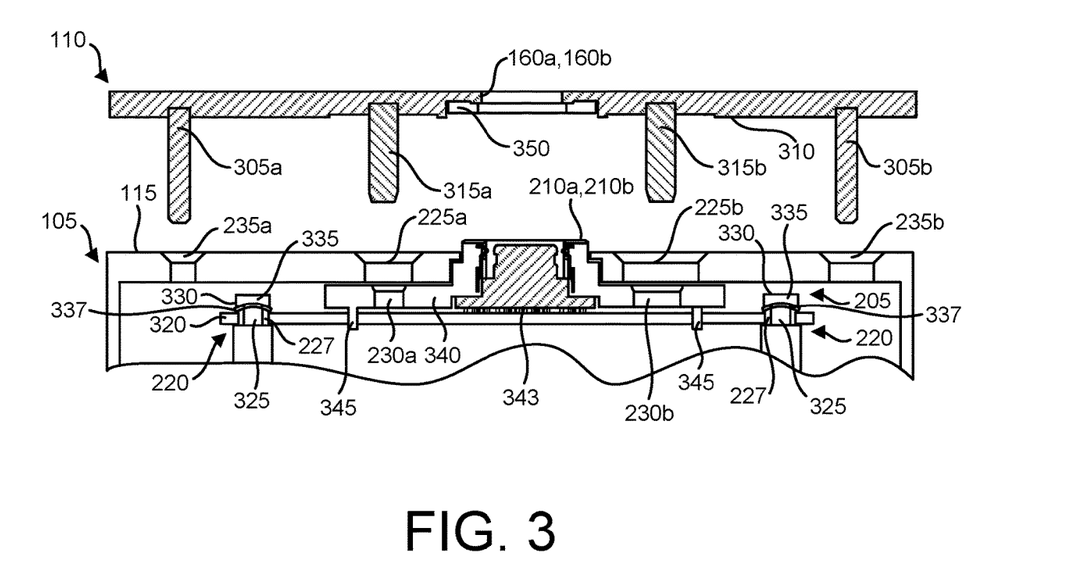
FIG. 3 is a simplified cross-sectional view of the electronic device shown in FIGS. 1 and 2 in the region of the floating connector assembly, with the cover removed.

FIG. 3 illustrates a simplified partial cross-sectional view of cover 110 detached from housing 105. As shown in FIG. 3, cover 110 includes first and second cover alignment pins 305a, 305b protruding from an interior surface 310 of the cover and positioned to engage with first and second alignment apertures 235a, 235b formed in housing 105. In some embodiments first and second cover alignment pins 305a, 305b can each have tapers at a distal end, and similarly first and second alignment apertures 235a, 235b can have tapers to enable easier initial alignment of cover 110 to housing 105. In various embodiments first alignment aperture 235a is a circular hole that is slightly larger than first alignment pin 305a and second alignment aperture 235b is a slot that has a width that is slightly larger than second alignment pin 305b and a length that is at least 1.5 times a diameter of the second alignment pin. In some embodiments first alignment pin 305a and first alignment aperture 235a are both circular and provide planar positioning of cover 110 to housing 105, and second alignment aperture 235b is a slot that provides rotational positioning of the cover to the housing, but enables the second pin greater horizontal positioning tolerance so the first cover alignment pin and the second cover alignment pin do not bind (as may be the case if second alignment aperture 235b were a circular hole of a similar size as second cover alignment pin 305b).

Cover 110 also includes first and second connector alignment pins 315a, 315b protruding from interior surface 310 of the cover and positioned to pass through first and second holes 225a, 225b in cover 110 and engage with first and second alignment openings 230a, 230b formed in floating connector assembly 205. More specifically, as first and second connector alignment pins 315a, 315b align with first and second alignment openings 230a, 230b, floating connector assembly 205 moves in-plane such that first and second connector sleeves 210a, 210b align with first and second connector apertures 160a, 160b in cover 110, as described in more detail below.

In some embodiments first and second connector alignment pins 315a, 315b can each have tapers and similarly first and second alignment openings 230a, 230b and first and second holes 225a, 225b can also have tapers to enable easier initial alignment of floating connector assembly 205 to first and second connector apertures 160a, 160b in cover 110. In various embodiments first alignment opening 230a is a circular hole that is slightly larger than first connector alignment pin 315a and second alignment opening 230b is a slot that has a width that is slightly larger than second connector alignment pin 315b and a length that is at least 1.5 times a diameter of the second connector alignment pin. In some embodiments first connector alignment pin 315a and first alignment opening 230a are both circular and provide planar positioning of floating connector assembly 205 to cover 110, and second alignment opening 230b is a slot that provides rotational positioning of the connector assembly to the cover, but enables second connector alignment pin 315b greater horizontal positioning tolerance so first connector alignment pin 315a and the second connector alignment pin do not bind (as may be the case if second alignment opening 230b were a circular hole of a similar size as second connector alignment pin 315b).

In some embodiments first and second alignment pins 305a, 305 be can be longer than first and second connector alignment pins 315a, 315b such that cover 110 is first aligned with housing 105, then connector assembly 205 is aligned with connector apertures 160a, 160b.

Floating connector assembly 205 includes a panel 320 that is substantially parallel to front surface 115 of housing 105 and is coupled to housing with compliant couplings 220. In one embodiment, each compliant coupling 220 includes a mounting hole 227 formed through panel 320. A body 325 of a fastener 330 extends through mounting hole 227 and is coupled to housing 105 with a thread or other retention mechanism. Fastener 330 includes a head 335 that has a larger diameter than body 325 such that a spring washer 337 can be captured by body 325 and by head 335 to be held in contact with panel 320. In some embodiments spring washer 337 may be what is commonly referred to as a belleville washer, a curved disk washer, a wave washer or any other type of suitable washer having a spring-like feature. Fastener 330 can be inserted in housing 105 an appropriate amount such that spring washer 337 exerts a force between panel 320 and head 335 such that the panel can move horizontally, but is held in place vertically (as oriented in FIG. 3) by forces exerted by one or more spring washers 337.

In another embodiment, compliant coupling 220 can include one or more elastomeric supports that affix panel 320 to housing 105. Elastomeric supports can enable floating connector assembly 205 to move and align first and second connectors 150a, 150b with first and second connector apertures 160a, 160b. In further embodiments the elastomeric supports can be electrically conductive and provide a ground path between panel 320 and housing 105.

In some embodiments panel 320 is a circuit board and provides electrical routing from first and second connectors 150a, 150b to circuitry within electronic device 100. In one embodiment panel 320 includes ground features that electrically couple to a housing ground through spring washer 337 to panel 320.

In some embodiments floating connector assembly 205 further includes a frame 340 that is mechanically coupled to panel 320 with one or more pins 345. Frame 340 is coupled to first and second connectors 150a, 150b such that mechanical forces applied to the connectors are supported through frame 340 to panel 320 such that electrical connections 343 between the first and second connectors and the panel are not damaged. More specifically, in some embodiments a force applied to a mated connector (not shown in FIG. 3) is transferred from the mated connector to connector sleeves 210a, 210b of frame 340. Frame 340 then transfers the force through one or more pins 345 to panel 320 which can absorb the force or can transfer the force to connector alignment pins 315a, 315b and to cover 110 that can absorb the force. During force transfer, electrical connections 343 are protected from the applied force, improving the reliability of first and second connectors 150a, 150b.

In some embodiments cover 110 can include one or more electromagnetic gaskets and/or shields 350 that are positioned to electrically and mechanically couple to first and second connector sleeves 210a, 210b of frame 340. Frame 340 can provide a ground contact for electromagnetic gaskets and/or shields 350 via spring washers 337 and/or electrical connections 343 to circuitry within housing 105. In further embodiments frame 340 can function as an electromagnetic shield for first and second connectors 150a, 150b and can be coupled to a ground via spring washers 337 and/or electrical connections 343 to circuitry within housing 105.

In some embodiments first and second cover alignment pins 305a, 305b can be longer than first and second connector alignment pins 315a, 315b such that when cover 110 is installed on housing 105, the cover first aligns with the housing via the cover alignment pins, then the connector alignment pins engage floating connector assembly 205 and align first and second connector 150a, 150b with first and second connector apertures 160a, 160b in cover 110.

Figure 4:
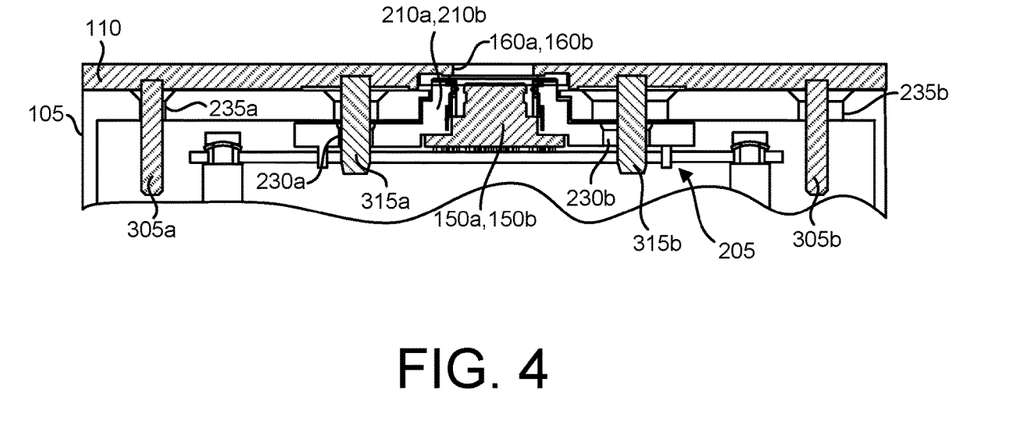
FIG. 4 is a simplified cross-sectional view of the electronic device shown in FIGS. 1 and 2 in the region of the floating connector assembly with the cover attached.

FIG. 4 illustrates a simplified partial cross-sectional view of cover 110 attached to housing 105, according to embodiments of the disclosure. As shown in FIG. 4, first and second cover alignment pins 305a, 305b are engaged with first and second alignment apertures 235a, 235b formed in housing 105. Similarly, first and second connector alignment pins 315a, 315b of cover 110 are engaged with first and second alignment openings 230a, 230b formed in floating connector assembly 205, positioning first and second connector sleeves 210a, 210b in alignment with connector first and second connector apertures 160a, 160b. In some embodiments first and second connectors 150a, 150b can be USB-C connectors having relatively small features and the use of the connector alignment mechanism and methods disclosed herein can enable alignment of first and second connectors 150a, 150b with first and second connector apertures 160a, 160b providing a user unrestricted access to the first and second connectors and also providing electronic device 100 (see FIG. 1) with an aesthetically appealing appearance. In other embodiments first and second connectors 150a, 150b can be any type of suitable connector, including but not limited to, USB-A, USB-B, HDMI or optical.

Figure 5:
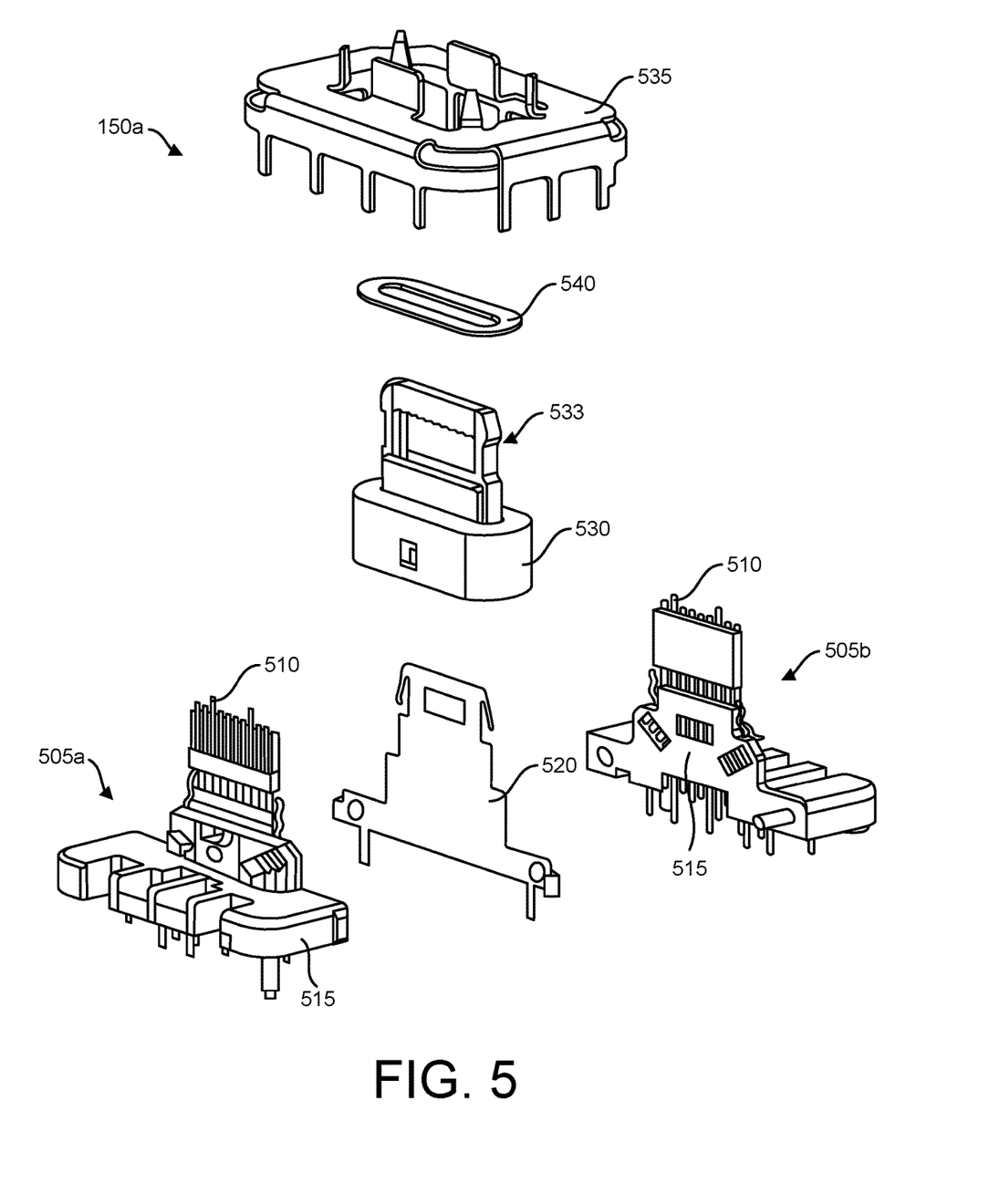
FIG. 5 is an exploded isometric view of a connector insert for the floating connector assembly shown in FIGS. 1-4.

FIGS. 5-9 illustrate various simplified isometric views of one embodiment of first and second connectors 150a, 150b and frame 340 (see FIG. 3) that are used to make a portion of floating connector assembly 205. As shown in FIG. 5, electrical connector 150a includes first and second leadframe assemblies 505a, 505b that each include a plurality of leads 510 that can be insert molded within dielectric carriers 515. A ground plate 520 can be positioned between first and second leadframe assemblies 505a, 505b to minimize crosstalk between the first and second leadframe assemblies.

First and second leadframe assemblies 505a, 505b and ground plate 520 can be inserted within a connector tongue 530. In some embodiments connector tongue 530 can be metallic and can be cast, machined, metal injection molded or formed by any other suitable process. Connector tongue 530 can include a distal tab portion 533. After insertion within connector tongue 530, first and second leadframe assemblies 505a, 505b can be potted in place with a dielectric potting material that at least partially encapsulates the first and second leadframe assemblies within the tongue. A grounding shell 535 can be fitted over and coupled to connector tongue 530 and first and second leadframe assemblies 505a, 505b. An optional cosmetic ring 540 can be affixed to tongue 530.

Figure 6:
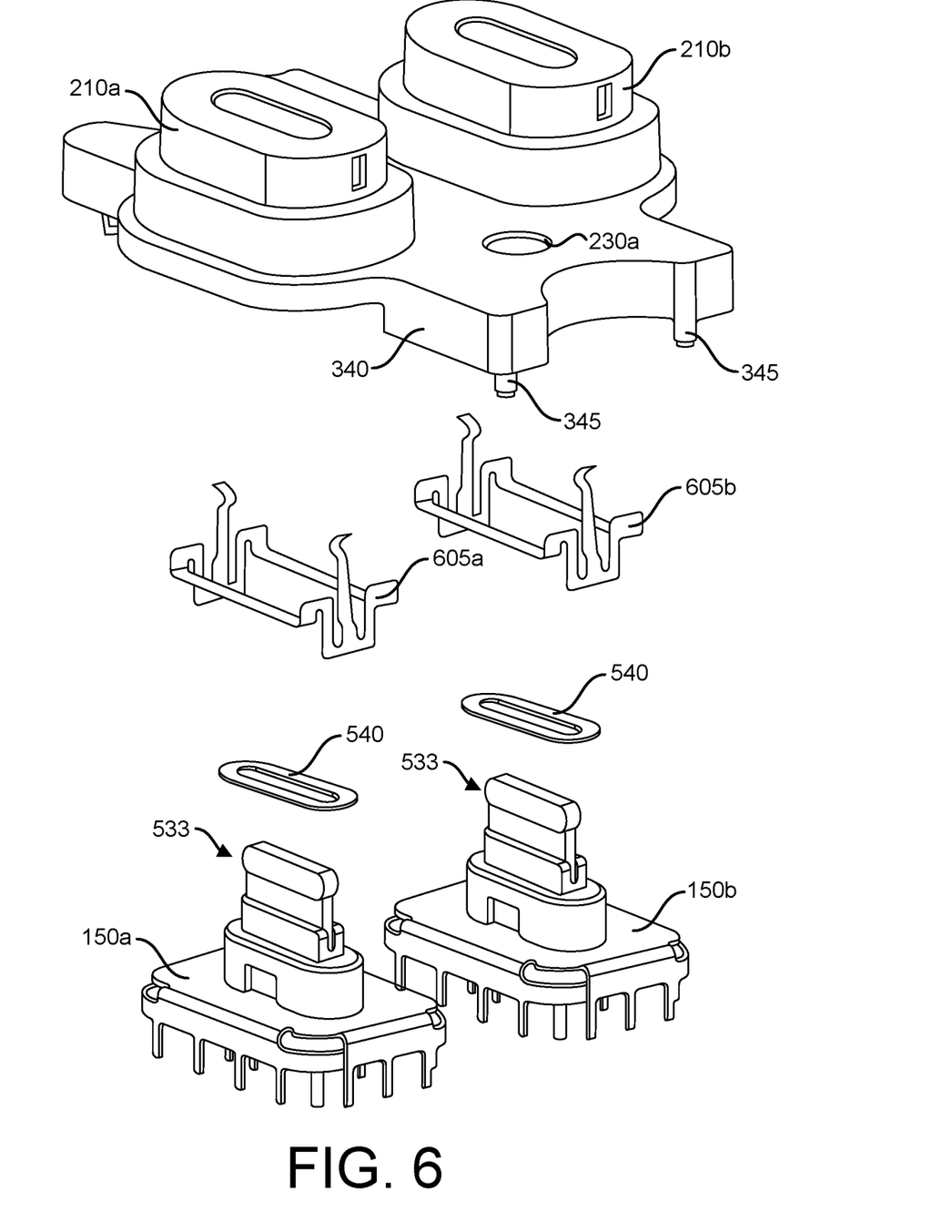
FIG. 6 is an exploded isometric view of the connector shown in FIGS. 1-4.

As shown in FIG. 6, first and second connectors 150a, 150b can each be fitted with corresponding first and second ground springs 605a, 605b and inserted within frame 340. In some embodiments frame 340 can be metallic and can be cast, machined, metal injection molded or formed by any other suitable process. First and second ground springs 605a, 605b can be positioned within frame 340 to make electrical contact with a mating connector when it is received within sleeves 210a, 210b of frame 340. As described above, frame 340 can include first and second alignment openings 230a, 230b (only first alignment opening 230 a is shown) that enable floating connector assembly 205 (see FIG. 3) to be aligned with cover 110. Frame 340 can also include one or more pins 345 that can electrically and mechanically couple frame to panel 320 (not shown in FIG. 6).

Figure 7:
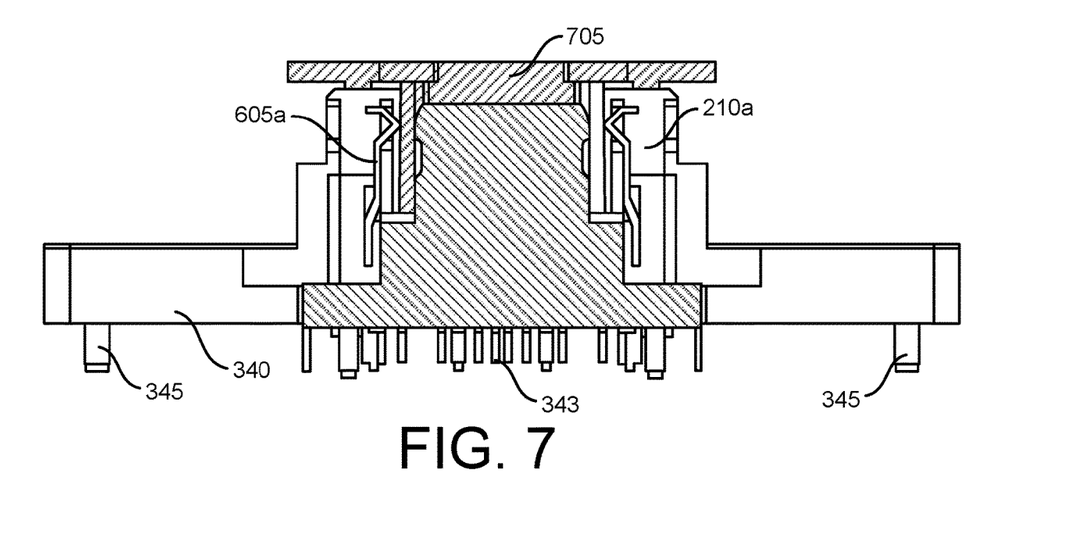
FIG. 7 is a simplified cross-sectional view of the connector shown in FIGS. 1-4.

As shown in FIG. 7, in some embodiments an alignment fixture 705 can be inserted within sleeve 210a of frame 340 to position distal tab portion 533 of connector tongue 530 within the sleeve. A portion of alignment fixture can emulate a mating connector and can be slidably engaged with the connector.

Figure 8:
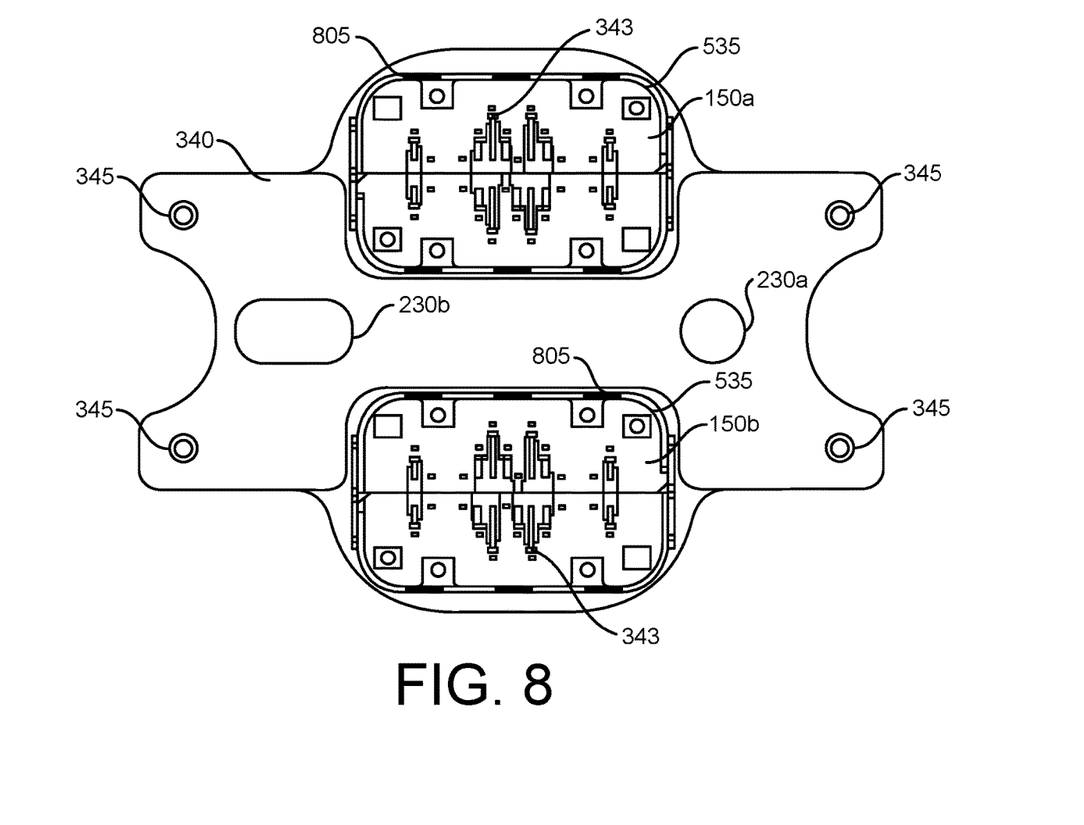
FIG. 8 is a simplified plan view of the connector shown in FIGS. 1-4.

As shown in FIG. 8, with alignment fixture 705 (see FIG. 7) engaged, first and second connectors 150a, 150b, can be attached to frame 340. In one embodiment one or more laser welds 805 are formed between ground shell 535 and frame 340 to secure first and second connectors 150a, 150b within the frame.

Figure 9:
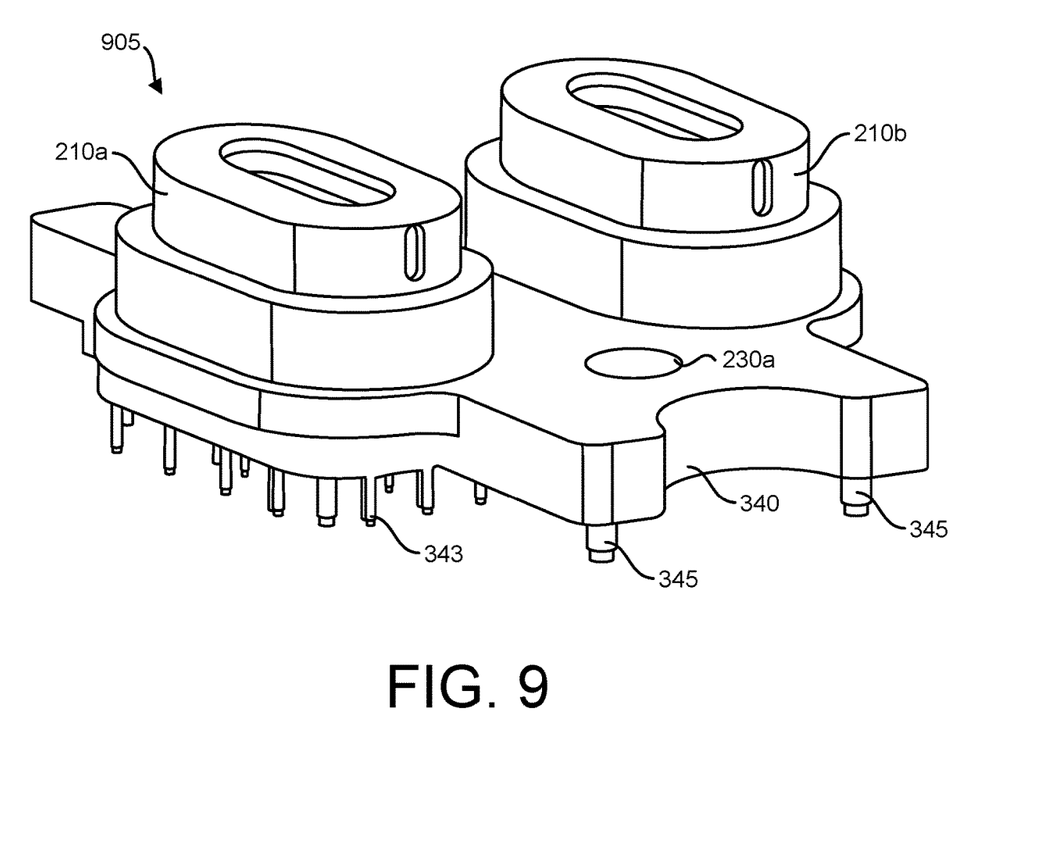
FIG. 9 is a simplified isometric view of the connector shown in FIGS. 1-4.

As shown in FIG. 9, a completed connector and frame assembly 905 is shown. Connector and frame assembly 905 can then be fastened to panel 320 that may be a circuit board. One or more electrical connections 343 of first and second connectors 150a, 150b can be electrically coupled to panel 320. One or more pins 345 can be positioned within mounting holes in panel and secured via fasteners, riveting or any other suitable process. In some embodiments one or more pins 345 can provide mechanical coupling and ground coupling to a circuit board and one or more electrical connections 343 can couple electrical signals to circuitry within electronic device 100.

Although electronic device 100 (see FIG. 1) is described and illustrated as one particular electronic device, embodiments of the disclosure are suitable for use with a multiplicity of electronic devices. For example, any device that receives or transmits audio, video or data signals can be used with embodiments of the disclosure. In some instances, embodiments of the disclosure are particularly well suited for use with electronic devices having one or more exterior electrical connectors. As used herein, an electronic media device includes any device with at least one electronic component that can be used to present human-perceivable media. Such devices can include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, as well as tablet (e.g., Apple's iPad devices), laptop or other mobile computers. Some of these devices can be configured to provide audio, video or other data or sensory output.

For simplicity, various internal components, such as the control circuitry, graphics circuitry, bus, memory, storage device and other components of electronic device 100 (see FIG. 1) are not shown in the figures.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An electronic device comprising:
    a housing including a front wall, a rear wall opposite the front wall and a plurality of sidewalls extending between the front wall and the rear wall, wherein the front wall defines first and second apertures;
    a connector assembly including a panel and an electrical connector, the electrical connector having a frame attached to the panel and a sleeve extending from the frame, wherein the sleeve is configured to receive a mating connector and the frame defines first and second alignment openings;
    a compliant coupling attaching the panel to the housing and positioning the first and second alignment openings in alignment with the first and second apertures, respectively, wherein the compliant coupling allows the panel to move parallel to the front wall; and
    an outer cover removably attached to the front wall and including first and second connector alignment pins that extend through the first and second apertures and through the first and second alignment openings aligning the sleeve with a connector aperture defined by the outer cover such that the sleeve can receive the mating connector through the connector aperture.

2. The electronic device of claim 1 wherein the outer cover includes first and second cover alignment pins that are aligned with and positioned within first and second alignment apertures defined by the front wall such that the outer cover is aligned with the housing.

3. The electronic device of claim 2 wherein the first and second cover alignment pins extend a first distance from the outer cover, the first and second connector alignment pins extend a second distance from the outer cover, and wherein the first distance is greater than the second distance.

4. The electronic device of claim 1 wherein the first alignment opening is a hole and the second alignment opening is a slot.

5. The electronic device of claim 1 wherein the sleeve is a first sleeve and the connector assembly includes a second sleeve extending from the frame.

6. The electronic device of claim 1 wherein the frame includes a plurality of pins that extend from the frame and attach the frame to the panel.

7. The electronic device of claim 1 wherein the panel is a circuit board.

8. The electronic device of claim 1 wherein the compliant coupling includes a plurality of fasteners that extend through a plurality of respective mounting holes defined by the panel and wherein a diameter of the plurality of fasteners is less than a diameter of the mounting holes.

9. An electronic device comprising:
    a housing including a front wall that defines first and second apertures;
    a panel attached to the housing with a compliant coupling;
    a connector including a frame attached to the panel and defining first and second alignment openings that are aligned with first and second apertures; and
    an outer cover removably attached to the front wall and including first and second connector alignment pins that extend through the first and second alignment openings and through the first and second apertures aligning a portion of the connector with a connector aperture defined by the outer cover such that the connector can receive a mating connector through the connector aperture.

10. The electronic device of claim 9 wherein the connector includes a pair of sleeves that extend from the frame.

11. The electronic device of claim 9 wherein the outer cover includes first and second cover alignment pins that align with first and second alignment apertures defined by the front wall such that the outer cover is aligned with the housing.

12. The electronic device of claim 9 wherein the first alignment opening is a hole and the second alignment opening is a slot.

13. The electronic device of claim 9 wherein the frame includes a plurality of pins that extend from the frame and attach the frame to the panel.

14. The electronic device of claim 9 wherein the panel is a circuit board.

15. The electronic device of claim 9 wherein the compliant coupling includes a plurality of fasteners that extend through a plurality of respective mounting holes defined by the panel and wherein a diameter of the plurality of fasteners is less than a diameter of the mounting holes.

16. An electronic device comprising:
    a housing including a front wall having an exterior surface opposite an interior surface and defining first and second apertures;
    a panel positioned proximate the interior surface and attached to the housing with a compliant coupling;
    a connector including a frame and a sleeve, wherein the frame defines first and second alignment openings that are aligned with first and second apertures and the frame is positioned between the panel and the interior surface, and wherein the sleeve extends from the frame through a connector opening defined by the front wall; and an outer cover removably attached to the front wall and including first and second connector alignment pins that extend through the first and second alignment openings and through the first and second apertures aligning a portion of the sleeve with a connector aperture defined by the outer cover such that the sleeve can receive a mating connector through the connector aperture.

17. The electronic device of claim 16 wherein the sleeve is a first sleeve and the connector includes a second sleeve extending from the frame.

18. The electronic device of claim 16 wherein the outer cover includes first and second cover alignment pins that align with first and second alignment apertures defined by the front wall such that the outer cover is aligned with the housing.

19. The electronic device of claim 16 wherein the first alignment opening is a hole and the second alignment opening is a slot.

20. The electronic device of claim 16 wherein the compliant coupling includes a plurality of fasteners that extend through a plurality of respective mounting holes defined by the panel and wherein a diameter of the plurality of fasteners is less than a diameter of the mounting holes.

\* \* \* \* \*